United States Patent
Takaya et al.

(10) Patent No.: US 9,847,414 B2
(45) Date of Patent: Dec. 19, 2017

(54) SEMICONDUCTOR DEVICE AND METHOD FOR MANUFACTURING SEMICONDUCTOR DEVICE HAVING A STEP PROVIDED IN A LATERAL SURFACE OF A TRENCH FORMED IN A SURFACE OF A SEMICONDUCTOR SUBSTRATE

(71) Applicant: Toyota Jidosha Kabushiki Kaisha, Toyota-shi, Aichi-ken (JP)

(72) Inventors: Hidefumi Takaya, Toyota (JP); Shinichiro Miyahara, Nagoya (JP); Katsuhiro Kutsuki, Nagakute (JP); Sachiko Aoi, Nagakute (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 42 days.

(21) Appl. No.: 14/942,547

(22) Filed: Nov. 16, 2015

(65) Prior Publication Data
US 2016/0141409 A1    May 19, 2016

(30) Foreign Application Priority Data
Nov. 17, 2014   (JP) ................... 2014-232461

(51) Int. Cl.
*H01L 29/732*    (2006.01)
*H01L 29/78*    (2006.01)
(Continued)

(52) U.S. Cl.
CPC .... *H01L 29/7813* (2013.01); *H01L 21/76237* (2013.01); *H01L 29/0623* (2013.01);
(Continued)

(58) Field of Classification Search
CPC .......... H01L 29/7813; H01L 21/76237; H01L 29/0623; H01L 29/42368; H01L 29/42376;
(Continued)

(56) References Cited

U.S. PATENT DOCUMENTS

2006/0289928 A1*  12/2006  Takaya ............... H01L 29/0623
                                                        257/330
2008/0087951 A1    4/2008  Takaya et al.
(Continued)

FOREIGN PATENT DOCUMENTS

JP    2006-093193 A    4/2006
JP    2006-128507 A    5/2006
(Continued)

*Primary Examiner* — Joseph C Nicely
*Assistant Examiner* — Pavel Ivanov
(74) *Attorney, Agent, or Firm* — Dinsmore & Shohl LLP

(57) ABSTRACT

A semiconductor device provided herein includes a trench in which a gate insulating layer (GIL) and a gate electrode are located. A step is provided in a lateral surface of the trench. The step surface descends toward a center of the trench. First and second regions are of a first conductivity type. A body region, a lateral region and a bottom region are of a second conductivity type. The first region, a body region, and the second region are in contact with the GIL at the upper lateral surface of the trench. The second region is in contact with the GIL at the lower lateral surface of the trench. A lateral region is in contact with the GIL at the lower lateral surface. A bottom region is in contact with the GIL at the bottom surface of the trench.

5 Claims, 19 Drawing Sheets

(51) Int. Cl.
  *H01L 29/66* (2006.01)
  *H01L 21/762* (2006.01)
  *H01L 29/423* (2006.01)
  *H01L 29/06* (2006.01)

(52) U.S. Cl.
  CPC .. *H01L 29/42368* (2013.01); *H01L 29/42376* (2013.01); *H01L 29/66734* (2013.01)

(58) Field of Classification Search
  CPC .......... H01L 29/66734; H01L 29/4236; H01L 29/42352; H01L 29/66613; H01L 21/28132; H01L 21/28141; H01L 21/2815; H01L 21/823864; H01L 29/66553; H01L 29/6656; H01L 29/66689; H01L 29/66719
  See application file for complete search history.

(56) References Cited

U.S. PATENT DOCUMENTS

| | | | |
|---|---|---|---|
| 2010/0140695 A1* | 6/2010 | Yedinak | H01L 29/7397 257/334 |
| 2014/0159144 A1* | 6/2014 | Cheng | H01L 29/42368 257/330 |

FOREIGN PATENT DOCUMENTS

| | | | |
|---|---|---|---|
| JP | 2009054638 A * | 3/2009 | |
| JP | 4-491307 B2 | 6/2010 | |

\* cited by examiner

SEMICONDUCTOR DEVICE AND METHOD FOR MANUFACTURING SEMICONDUCTOR DEVICE HAVING A STEP PROVIDED IN A LATERAL SURFACE OF A TRENCH FORMED IN A SURFACE OF A SEMICONDUCTOR SUBSTRATE

CROSS-REFERENCE TO RELATED APPLICATION

This application claims priority to Japanese Patent Application No. 2014-232461 filed on Nov. 17, 2014, the contents of which are hereby incorporated by reference into the present application.

TECHNICAL FIELD

A technology disclosed herein relates to a semiconductor device having a gate electrode located in a trench.

DESCRIPTION OF RELATED ART

Japanese Patent Application Publication No. 2006-93193A discloses a MOSFET having a gate electrode located in a trench. In this MOSFET, a step is formed in a lateral surface of the trench. Further, a lateral p-type region and a bottom p-type region are formed in a semiconductor substrate. The lateral p-type region is in contact with a gate insulating layer at a portion of the lateral surface of the trench located near the step. The bottom p-type region is in contact with the gate insulating layer at a bottom surface of the trench. The lateral p-type region and the bottom p-type region are surrounded by a drift region of an n-type. When this MOSFET switches from being on to being off, a depletion layer spreads from a body region of the p-type to the drift region of the n-type. Once the depletion layer, which has spread from the body region to the drift region, reaches the lateral p-type region, the depletion layer spreads from the lateral p-type region to a portion of the drift region located around the lateral p-type region. Once the depletion layer, which has spread from the lateral p-type region to the drift region, reaches the bottom p-type region, the depletion layer spreads from the bottom p-type region to a portion of the drift region located around the bottom p-type region. In this way, the extension of the depletion layer is facilitated by the lateral p-type region and the bottom p-type region in an area around the trench. This allows a wide range of the drift region to be depleted. For this reason, this MOSFET has excellent withstand voltage characteristics.

BRIEF SUMMARY

The present specification provides a technology for further improving withstand voltage characteristics of a semiconductor device having semiconductor regions located in lateral and bottom parts of a trench and configured to facilitate extension of a depletion layer.

A semiconductor device disclosed herein, comprises: a semiconductor substrate having a surface in which a trench is provided; a gate insulating layer covering an inner surface of the trench; and a gate electrode located in the trench. A step is provided in a lateral surface of the trench. The lateral surface of the trench comprises an upper lateral surface located on an upper side of the step, a step surface which is a surface of the step, and a lower lateral surface located on a lower side of the step. The step surface slopes downward as it extends toward a center of the trench. The semiconductor substrate comprises a first region, a body region, a second region, a lateral region, and a bottom region. The first region is of a first conductivity type and in contact with the gate insulating layer at the upper lateral surface. The body region is of a second conductivity type and in contact on the lower side of the first region with the gate insulating layer at the upper lateral surface. The second region is of the first conductivity type, extends from a position in contact with the body region to a position located on the lower side of a bottom surface of the trench, in contact on the lower side of the body region with the gate insulating layer at the upper lateral surface, and in contact with the gate insulating layer at the lower lateral surface. The lateral region is of the second conductivity type, in contact with the gate insulating layer at the lower lateral surface, surrounded by the second region, and separated from the body region by the second region. The bottom region is of the second conductivity type, in contact with the gate insulating layer at the bottom surface of the trench, surrounded by the second region, and separated from the body region and the lateral region by the second region.

The term "upper side" used herein means the side of the surface of the semiconductor substrate in which the trench is provided. The term "lower side" as used herein means the side of a surface (i.e. a back surface) opposite to the surface of the semiconductor substrate in which the trench is provided. Further, the clause "the step surface slopes downward as it extends toward a center of the trench" means a connection portion between the step surface and the upper lateral surface is located on an upper side of a connection portion between the step surface and the lower lateral surface. Therefore, a portion that does not slope may be provided as a part of the step surface.

In this semiconductor device, the step surface slopes downward toward the center of the trench. Since the step surface slopes in this manner, the step surface has a width in a vertical direction which extends from the upper side to the lower side. The lateral region can be formed by implanting impurities into the step surface. Utilization of a step surface having a width in the vertical direction makes it possible to form a lateral region having a great width in the vertical direction. When this semiconductor device switches from being on to being off, a depletion layer extends from the body region into the second region. The depletion layer spreads to an area around the trench through the lateral region and the bottom region. When the lateral region extends widely in the vertical direction, it is easy for the depletion layer, which extends from the lateral region, to widely extend in the vertical direction. The wide extension of the depletion layer of this manner can hold a high potential difference. Therefore, the structure of this semiconductor device makes it possible to further improve withstand voltage characteristics than does that of the conventional semiconductor device.

Further a method for manufacturing a semiconductor device is disclosed herein. This method comprises a high density semiconductor region forming process, a trench forming process, an impurities implanting process, a gate insulating layer forming process, and a gate electrode forming process. In the high density semiconductor region forming process, a high density semiconductor region is formed on a low density semiconductor region of a semiconductor substrate. The low density semiconductor region is of a first conductivity type. The high density semiconductor region is of the first conductivity type or a second conductivity type. The high density semiconductor region has a density of impurities higher than that of the low density semiconductor region. In the trench forming process, a surface of the semiconductor substrate is etched so as to form a trench penetrating the high density semiconductor region to reach the low density semiconductor region and having a lateral surface in which a step is formed. In the impurities implanting process, impurities of the second conductivity type are implanted into a bottom surface of the trench and a step surface which is a surface of the step. In the gate insulating film forming process, a gate insulating layer covering an inner surface of the trench is formed. In the gate electrode forming process, a gate electrode is formed in the trench.

In the formation of the trench, the trench, having the lateral surface in which the step is formed, can be formed by etching the semiconductor substrate, because an etching rate in the high density semiconductor region is higher than that in the low density semiconductor region. Forming the trench in this manner causes the step surface to be in a shape that slopes downward as the step surface extends toward a center of the trench. In the implantation of the impurities, the impurities of the second conductivity type implanted into the bottom surface of the trench forms a bottom region of the second conductivity type in a range exposed on a bottom surface of the step. Further, the impurities of the second conductivity type implanted into the step surface forms a lateral region of the second conductivity type in a range exposed on a portion of the lateral surface of the trench located on the lower side of the step (i.e. in the low density semiconductor region). Since the step surface slopes in the manner described above, the lateral region having a great width in the vertical direction is formed. After that, the gate insulating layer and the gate electrode are formed in the trench. In a semiconductor device manufactured by this method, the lateral region and the bottom region prevent a high electric field from being generated in an area around the trench. In particular, since the lateral region has a great width in the vertical direction, an electric field can be more effectively suppressed in an area around the trench. Therefore, this method makes it possible to manufacture a semiconductor device having high withstand voltage characteristics.

DETAILED DESCRIPTION

Embodiment 1

Figure 2:
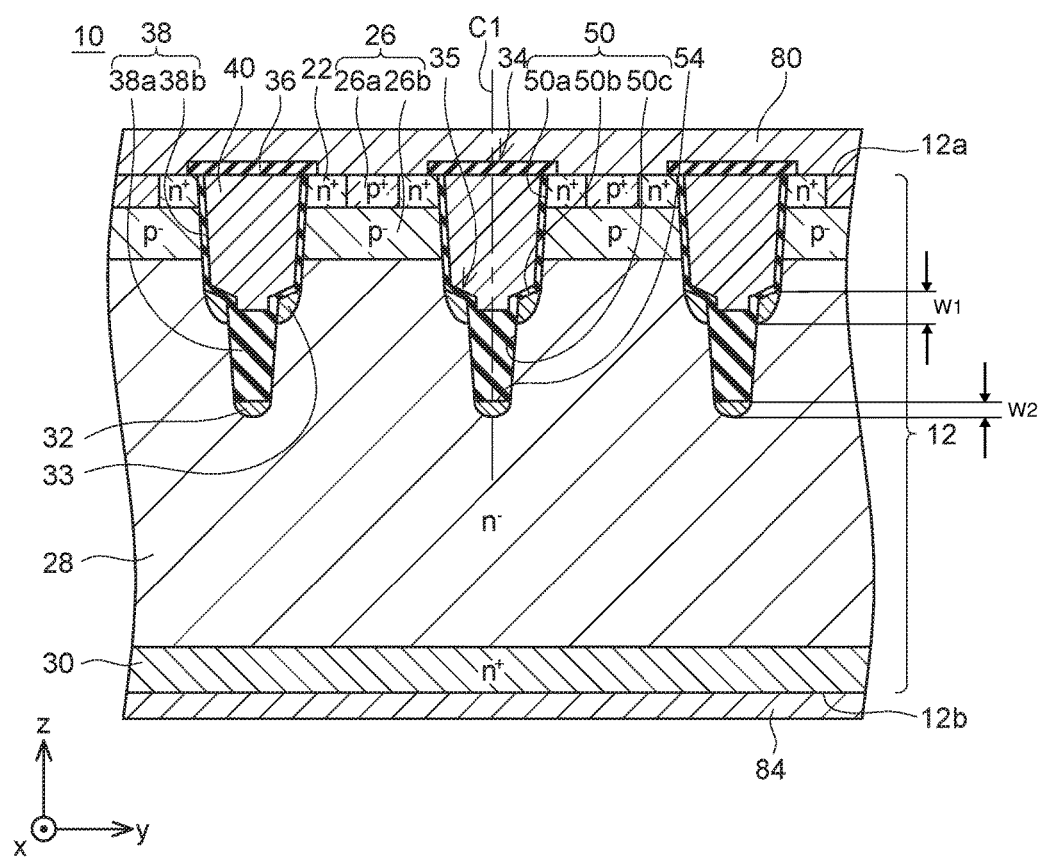
FIG. 2 is a vertical sectional view of the semiconductor device 10 as taken along the line II-II of FIG. 1.
Figure 3:
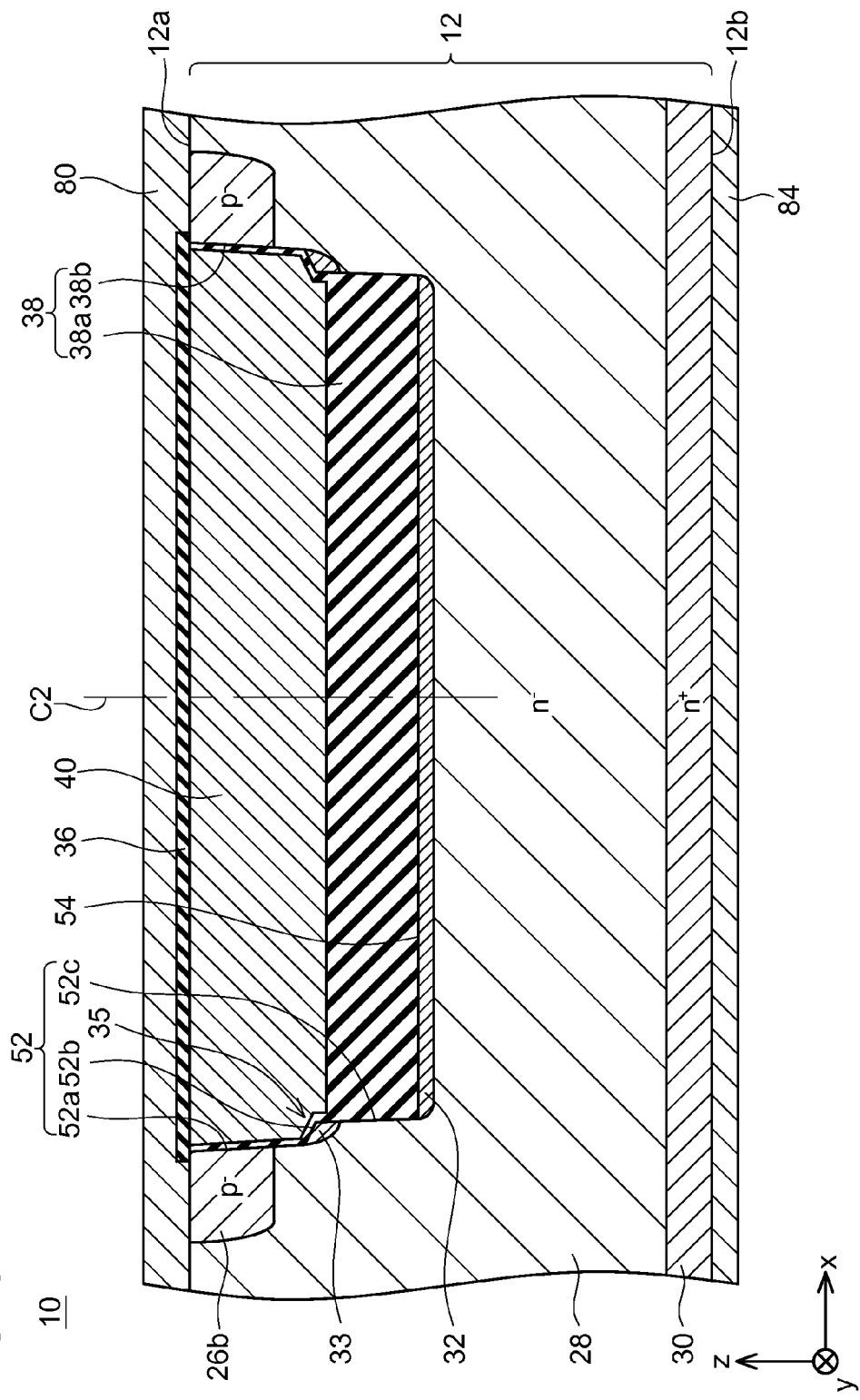
FIG. 3 is a vertical sectional view of the semiconductor device 10 as taken along the line III-III of FIG. 1.

As shown in FIGS. 2 and 3, a semiconductor device 10 according to Embodiment 1 includes a semiconductor substrate 12 and electrodes, insulating layers, and the like provided on a front surface 12a or a back surface 12b of the semiconductor substrate 12. The semiconductor substrate 12 is made of 4H-SiC. It should be noted below that a thickness direction of the semiconductor substrate 12 is referred to as a z direction, that a direction of the semiconductor substrate 12 that is parallel to the front surface 12a is referred to as an x direction, and that a direction that is orthogonal to the x direction and the z direction is referred to as a y direction.

As shown in FIGS. 2 and 3, a source electrode 80 is provided on the front surface 12a of the semiconductor substrate 12. A drain electrode 84 is provided on the back surface 12b of the semiconductor substrate 12. The drain electrode 84 covers substantially the whole area of the back surface 12b.

Figure 1:
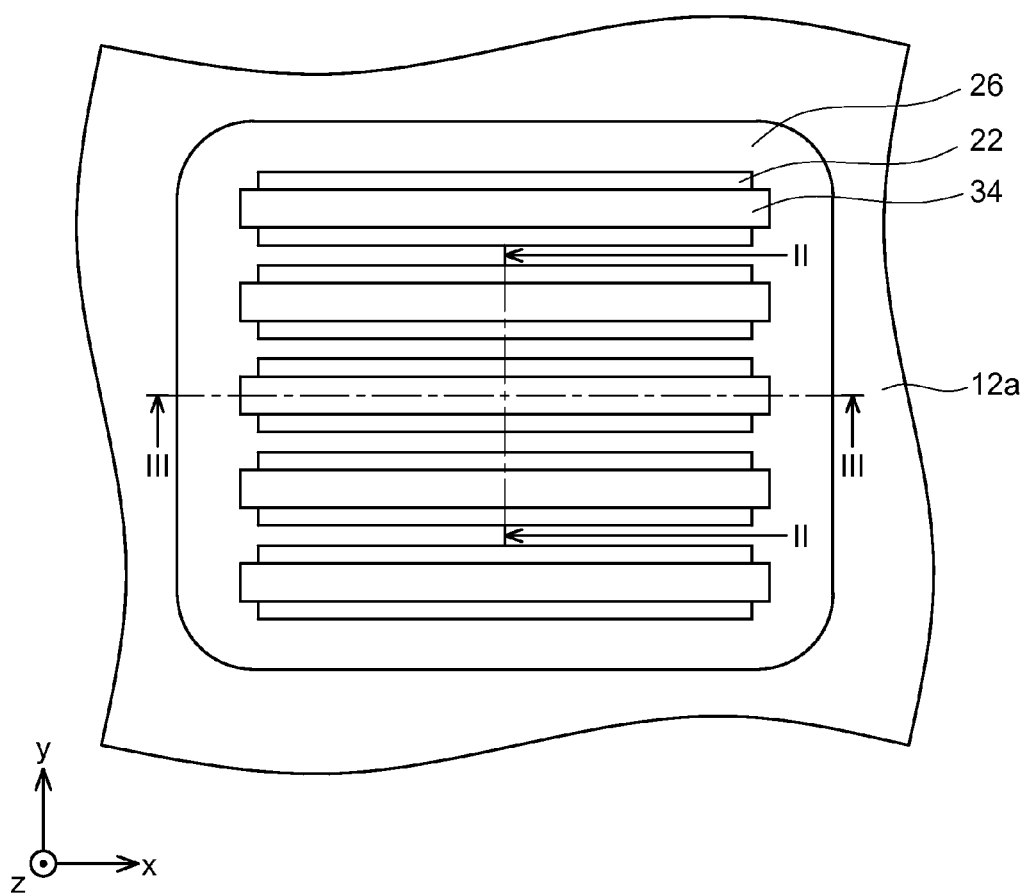
FIG. 1 is a plan view of a semiconductor device 10 with the omission of an electrode and an insulating layer on a front surface 12a of a semiconductor substrate 12.

FIG. 1 shows a plan view of the semiconductor device 10 with the omission of the electrodes, the insulating layers, and the like on the front surface 12a. As shown in FIG. 1, a plurality of trenches 34 is provided in the front surface 12a of the semiconductor substrate 12. Each of the trenches 34 extends in the x direction. The plurality of trenches 34 is placed at intervals in the y direction.

As shown in FIGS. 2 and 3, each of the trenches 34 has lateral surfaces 50 and 52. Each lateral surface 50 is a lateral surface that defines each end of the trench 34 in a transverse direction (i.e. the y direction) of the trench 34. Each lateral surface 52 is a lateral surface that defines each end of the trench 34 in a longitudinal direction (i.e. the x direction) of the trench 34. A step 35 is formed in each side of the lateral surfaces 50 and 52 in each trench 34.

As shown in FIG. 2, each lateral surface 50 in the transverse direction includes an upper lateral surface 50a located on an upper side of the corresponding step 35, a step surface 50b of the corresponding step 35, and a lower lateral surface 50c located on a lower side of the corresponding step 35. Each step surface 50b of the step 35 slopes downward as it extends toward a center C1 of the trench 34 in the y direction. That is, a set of the step surfaces 50b of a pair of portions of the step 35 provided in the lateral surfaces 50 on both sides of each trench 34 slopes in a tapered shape. Each upper lateral surface 50a and each lower lateral surface 50c extend substantially along the z direction, although they slightly slope in a tapered shape.

As shown in FIG. 3, each lateral surface 52 in the longitudinal direction includes an upper lateral surface 52a located on the upper side of each step 35, a step surface 52b of each step 35, and a lower lateral surface 52c located on the lower side of each step 35. Each surface 52b of the step 35 slopes downward as it extends toward a center C2 of the trench 34 in the x direction. That is, a set of the step surfaces 52b of a pair of portions of the steps 35 provided in the lateral surfaces 52 on both sides of the trench 34 slope in a tapered shape. Each upper lateral surface 52a and each lower lateral surface 52c extend substantially along the z direction, although they slightly slope in a tapered shape.

As shown in FIGS. 2 and 3, a gate insulating layer 38 and a gate electrode 40 are provided in each of the trenches 34. Each gate insulating layer 38 includes a bottom insulating layer 38a and a lateral insulating film 38b. Each bottom insulating layer 38a is a thick insulating layer provided in a bottom part of the trench 34. Each bottom insulating layer 38a is provided in a portion of the trench 34 located on the lower side of the step 35. Portions of the lateral surfaces 50 and 52 of each trench 34 located on an upper side of the bottom insulating layer 38a is covered with the lateral insulating film 38b. That is, each lateral insulating film 38b covers the upper lateral surfaces 50a and 52a and the surfaces 50b and 52b of the step 35. Each lateral insulating film 38b is connected to the bottom insulating layer 38a. Each gate electrode 40 is located in a portion of the trench 34 located on the upper side of the bottom insulating layer 38a. Each gate electrode 40 is insulated from the semiconductor substrate 12 by the lateral insulating film 38b and the bottom insulating layer 38a. An upper surface of each gate electrode 40 is covered with an interlayer insulating layer 36. Each gate electrode 40 is insulated from the source electrode 80 by the interlayer insulating layer 36.

In the semiconductor substrate 12, source regions 22, body regions 26, a drift region 28, a drain region 30, bottom regions 32, and lateral regions 33 are provided.

As shown in FIG. 2, a plurality of source regions 22 is provided in the semiconductor substrate 12. Each of the source regions 22 is an n-type region. The each source region 22 is provided at a position adjacent to each trench 34 in the y direction. Each source region 22 is in contact with the lateral insulating film 38b at the upper lateral surface 50a of the trench 34. Each source region 22 is formed in a range exposed on the front surface 12a of the semiconductor substrate 12. Each source region 22 is in ohmic contact with the source electrode 80.

Each body region 26 is provided on lateral and lower sides of the source region 22 and is in contact with the source region 22. Each body region 26 is a p-type region and has a high density region 26a and a low density region 26b. Each high density region 26a has a p-type impurity density higher than that of the low density region 26b. Each high density region 26a is provided on the lateral side of the source region 22 and exposed on the front surface 12a of the semiconductor substrate 12. Each high density region 26a is in ohmic contact with the source electrode 80. Each low density region 26b is provided on the lower sides of the source region 22 and the high density region 26a. Each low density region 26b is in contact with the lateral insulating film 38b at a portion of the upper lateral surface 50a of the trench 34 located on the lower side of the source region 22. Further, as shown in FIG. 3, each low density region 26b is also provided at a position adjacent to the lateral surface 52 of the trench 34 in the longitudinal direction of the trench 34. Each low density region 26b is in contact with the lateral insulating film 38b at the upper lateral surface 52a of the trench 34.

The drift region 28 is an n-type region containing a low density of n-type impurities. An n-type impurity density of the drift region 28 is lower than that of the source region 22. As shown in FIG. 2, the drift region 28 is provided on a lower side of the low density regions 26b and is in contact with the low density regions 26b. The drift region 28 extends from a position at a lower end of the low density regions 26b to a position lower than lower ends of the trenches 34. The drift region 28 is separated from the source regions 22 by the body regions 26. The drift region 28 is in contact with the lateral insulating films 38b at portions of the upper lateral surfaces 50a located on lower sides of the body regions 26. Further, the drift region 28 is in contact with the bottom insulating layers 38a at the lower lateral surfaces 50c. Further, as shown in FIG. 3, the drift region 28 is also provided at positions adjacent to the lateral surfaces 52 of the trenches 34 in the longitudinal direction of the trenches 34. The drift region 28 is in contact with the lateral insulating films 38b at portions of the upper lateral surfaces 52a located on the lower side of the low density regions 26b. Further, the drift region 28 is in contact with the bottom insulating layers 38a at the lower lateral surfaces 52c.

The aforementioned source regions 22, the aforementioned body region 26, and the aforementioned drift region 28 face the gate electrodes 40 via the lateral insulating films 38b.

The lateral regions 33 are p-type regions. As shown in FIG. 2, each lateral region 33 is provided on the lower side of the step 35. Each lateral region 33 is provided in a range exposed on the step surface 50b and a portion of the lower lateral surface 50c located near the step 35. Each lateral region 33 is in contact with the lateral insulating film 38b in the whole area of the step surface 50b. Further, each lateral region 33 is in contact with the bottom insulating layer 38a at a portion of the lower lateral surface 50c located near the step 35. Further, as shown in FIG. 3, each lateral region 33 is also provided at a position adjacent to the lateral surface 52 of the trench 34 in the longitudinal direction of the trench 34. Each lateral region 33 is in contact with the lateral insulating film 38b at the step surface 52b. Further, each lateral region 33 is in contact with the bottom insulating layer 38a at a portion of the lower lateral surface 52c located near the step 35. A width W1 of each lateral region 33 from an upper end of the lateral region 33 to a lower end of the lateral region 33 in the vertical direction which extends from the upper end of the lateral region 33 to the lower end of the lateral region 33 is greater than widths of the step surfaces 50b and 52b in the vertical direction. Each lateral region 33 is surrounded by the drift region 28. Each lateral region 33 is separated from the body region 26 by the drift region 28. Each lateral region 33 is connected to none of the electrodes, and a potential of each lateral region 33 is a floating potential.

The bottom regions 32 are p-type regions. As shown in FIGS. 2 and 3, each bottom region 32 is provided at a position exposed on a bottom surface 54 of each of the trenches 34. Each bottom region 32 is in contact with the bottom insulating layer 38a in the whole area of the bottom surface 54 of the trench 34. A width W2 of each bottom region 32 from an upper end of the bottom region 32 to a lower end of the bottom region 32 in the vertical direction is smaller than the width W1 of the each lateral region 33 from the upper end of the lateral region 33 to the lower end of the lateral region 33 in the vertical direction, as shown in FIG. 2. Each bottom region 32 is surrounded by the drift region 28. The bottom region 32 is separated from the body regions 26 and the lateral regions 33 by the drift region 28. Each bottom region 32 is connected to none of the electrodes, and a potential of each bottom region 32 is a floating potential.

The drain region 30 is an n-type region containing a high density of n-type impurities. An n-type impurity density of the drain region 30 is higher than that of the drift region 28. The drain region 30 is provided on a lower side of the drift region 28. The drain region 30 is in contact with the drift region 28 and is separated from the body regions 26, the bottom regions 32, and the lateral regions 33 by the drift region 28. The drain region 30 is provided in a range exposed on the back surface 12b of the semiconductor substrate 12. The drain region 30 is in ohmic contact with the drain electrode 84.

The following describes how the semiconductor device 10 operates. In the semiconductor substrate 12, a MOSFET of an n-channel type is provided by the source regions 22, the body regions 26, the drift region 28, the drain region 30, the gate electrodes 40, the gate insulating layers 38, and the like. In order for the semiconductor device 10 to operate, a higher potential is applied to the drain electrode 84 than that which is applied to the source electrode 80. Furthermore, the application of a potential equal to or higher than a threshold value to the gate electrodes 40 causes the MOSFET to be turned on. That is, channels are provided in portions of the body regions 26 located in ranges in contact with the lateral insulating films 38b. Electrons thereby flow from the source electrode 80 toward the drain electrode 84 through the source regions 22, the channels, the drift region 28, and the drain region 30.

Reducing the potential of the gate electrodes 40 to a potential lower than the threshold value causes the channel to disappear, thus causing the MOSFET to be turned off. This spreads a depletion layer into the drift region 28 from a pn junction at a boundary between the body regions 26 and the drift region 28. The depletion layer, which extends from the body regions 26, reaches the lateral regions 33. Then, the depletion layer spreads from the lateral regions 33 into portions of the drift region 28 located around the lateral regions 33. The depletion layer, which extends from the lateral regions 33, reaches the bottom regions 32. Then, the depletion layer spreads from the bottom regions 32 into portions of the drift region 28 located around the bottom regions 32. After that, the depletion layer extends over the whole area of the drift region 28. Since the extension of the depletion layer is thus facilitated by the lateral regions 33 and the bottom regions 33, a wide range of the drift region 28 is depleted. This improves the withstand voltage characteristics of the semiconductor device 10. As will be described in detail later, in the semiconductor device 10 of the present embodiment, a width of each lateral region 33 in the thickness direction (i.e. the z direction) of the semiconductor substrate 12 is greater than it has conventionally been. This makes it easy for the depletion layer to spread comparatively thick in the z direction when the depletion layer extends from the lateral regions 33 to areas around the lateral regions 33. For this reason, when the depletion layer extends from the lateral regions 33 to areas around the lateral regions 33, an electric field can be received by the thick depletion layer. This makes it hard for a high electric field to be generated, thus the withstand voltage characteristics of the semiconductor device 10 are effectively improved.

Figure 4:
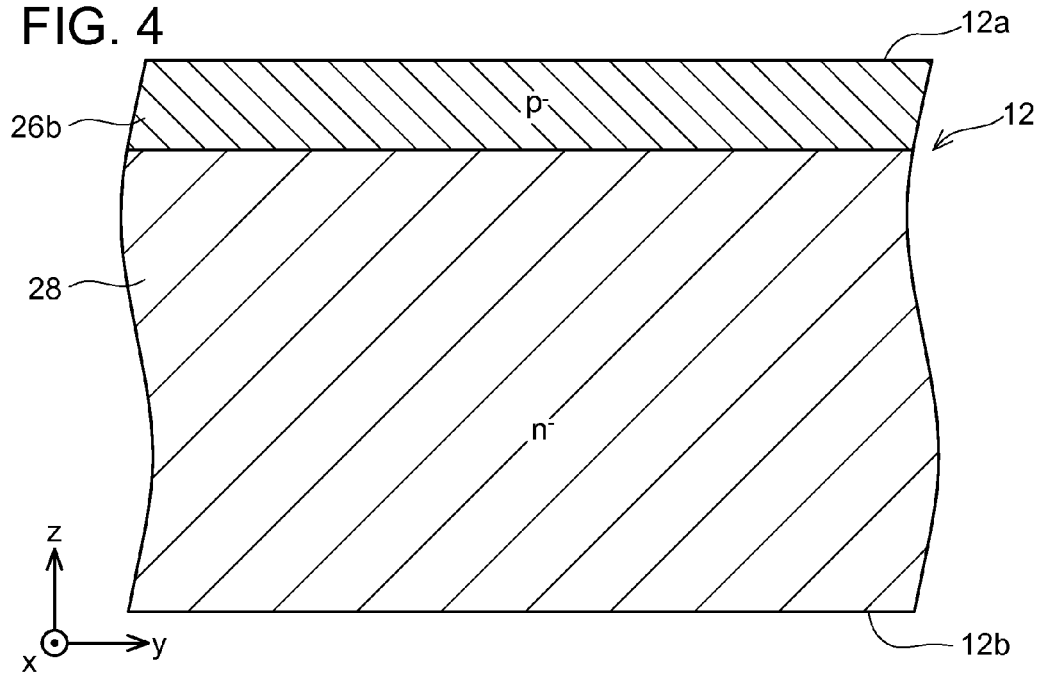
FIG. 4 is a vertical sectional view of the semiconductor substrate 12 in which a region 26b has been formed.

The following describes a method for manufacturing a semiconductor device 10. The semiconductor device 10 is manufactured from an n-type semiconductor substrate 12 entirely having substantially the same n-type impurity density as that of the drift region 28. First, in the implantation of p-type impurity ions, as shown in FIG. 4, a low density region 26b of a p-type (i.e. a portion of a body region 26) is formed in a range exposed on a front surface 12a of the semiconductor substrate 12. The p-type impurities are implanted at a density higher than an n-type impurity density of the original semiconductor substrate 12 (i.e. the drift region 28). Therefore, a p-type impurity density of the low density region 26b is higher than the n-type impurity density of the drift region 28.

Figure 5:
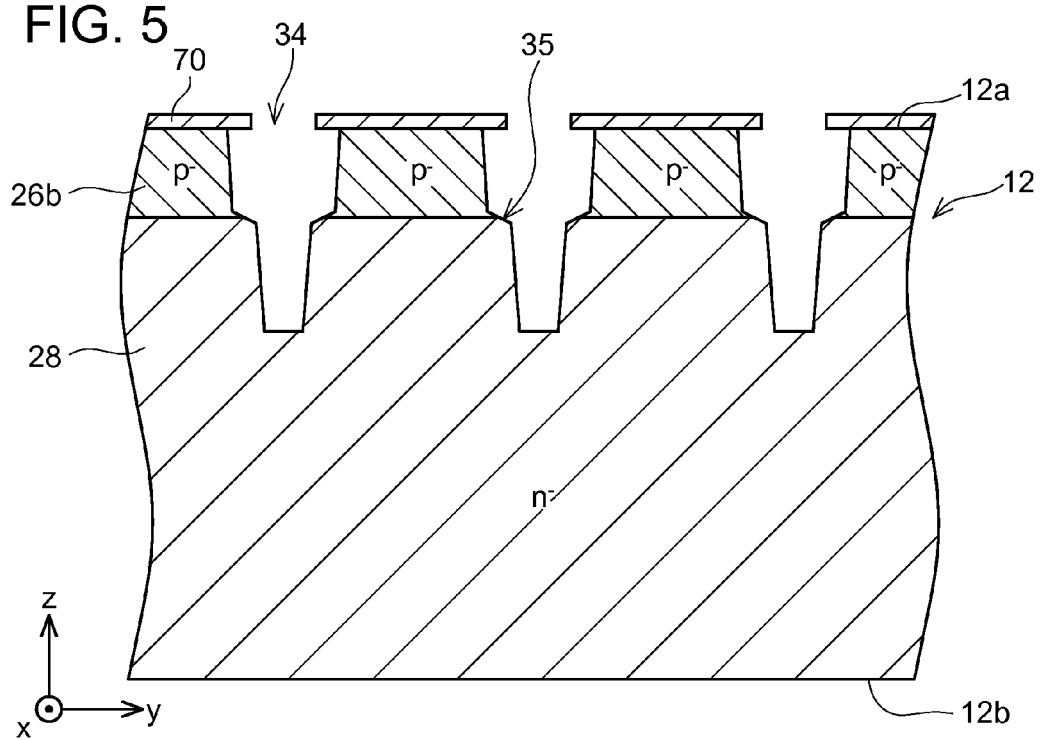
FIG. 5 is a vertical sectional view of the semiconductor substrate 12 in which a trench 34 is being formed.
Figure 6:
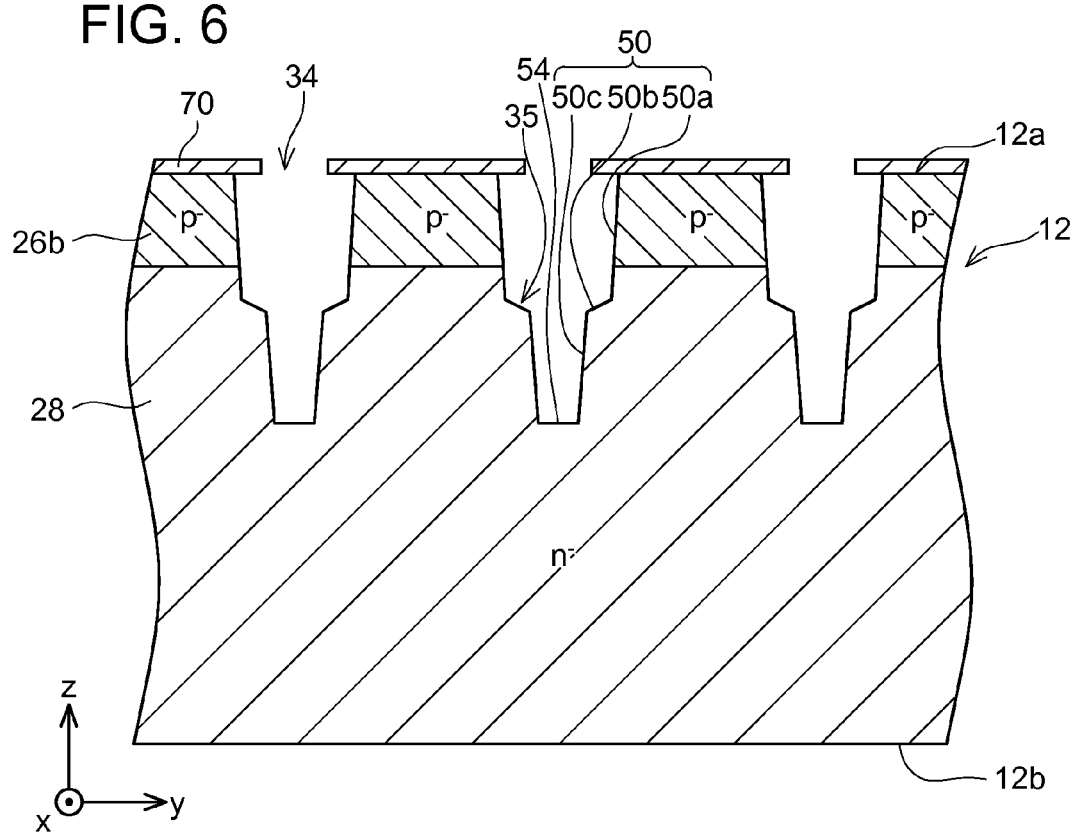
FIG. 6 is a vertical sectional view of the semiconductor substrate 12 in which a trench 34 has been formed.
Figure 7:
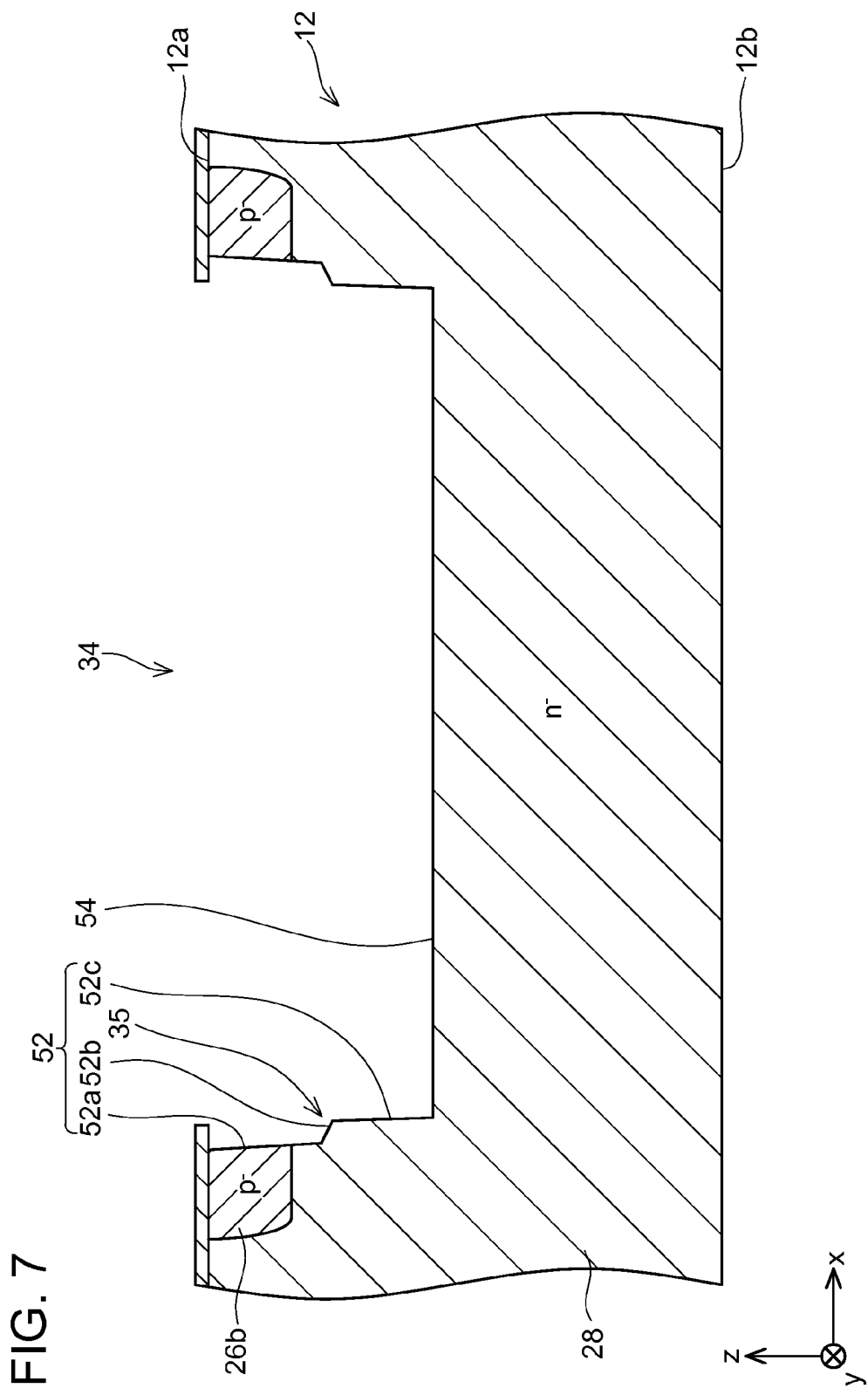
FIG. 7 is a vertical sectional view of the semiconductor substrate 12 in which the trench 34 has been formed.

Next, as shown in FIG. 5, an etching mask 70 is formed on the front surface 12a of the semiconductor substrate 12, and the semiconductor substrate 12 is etched through the etching mask 70. The semiconductor substrate 12 is etched by anisotropic dry etching. This forms trenches 34 in the front surface 12a of the semiconductor substrate 12. As noted above, the p-type impurity density of the low density region 26b is higher than the n-type impurity density of the drift region 28. For this reason, an etching rate in the low density region 26b is higher than that in the drift region 28. In other words, the low density region 26b is etched at a higher speed than the drift region 28. For this reason, as shown in FIG. 5, the trenches 34 that cut into the drift region 28 are formed so that a width of each trench 34 in the low density region 26b is greater than a width of each trench 34 in the drift region 28. As a result, a step 35 is formed in a lateral surface of each trench 34 at a depth of a boundary between the low density region 26b and the drift region 28. Each step 35 is also formed in a lateral surface of each trench 34 in a longitudinal direction of each trench 34. Further continuation of the etching from the state shown in FIG. 5 deepens the trenches 34 as shown in FIG. 6 so that each step 35 comes to be located in the drift region 28. Further, in a cross-section of each trench 34 in the longitudinal direction of each trench 34, too, as shown in FIG. 7, each step 35 comes to be located in the drift region 28. In this way, this method allows trenches 34 having steps 35 in its lateral surfaces 50 and 52 to be formed by utilizing the difference in etching rate between the low density region 26b and the drift region 28 that is caused by the difference in impurity density. This method allows trenches 34 having steps 35 to be formed in a single etching process. Further, this method allows the surface 50b of the each step 35 to be formed in a shape that slopes downward as the surface 50b extends toward a center of the trench 34. Once the structure shown in FIGS. 6 and 7 is obtained, the etching is stopped and the etching mask 70 is removed.

Figure 8:
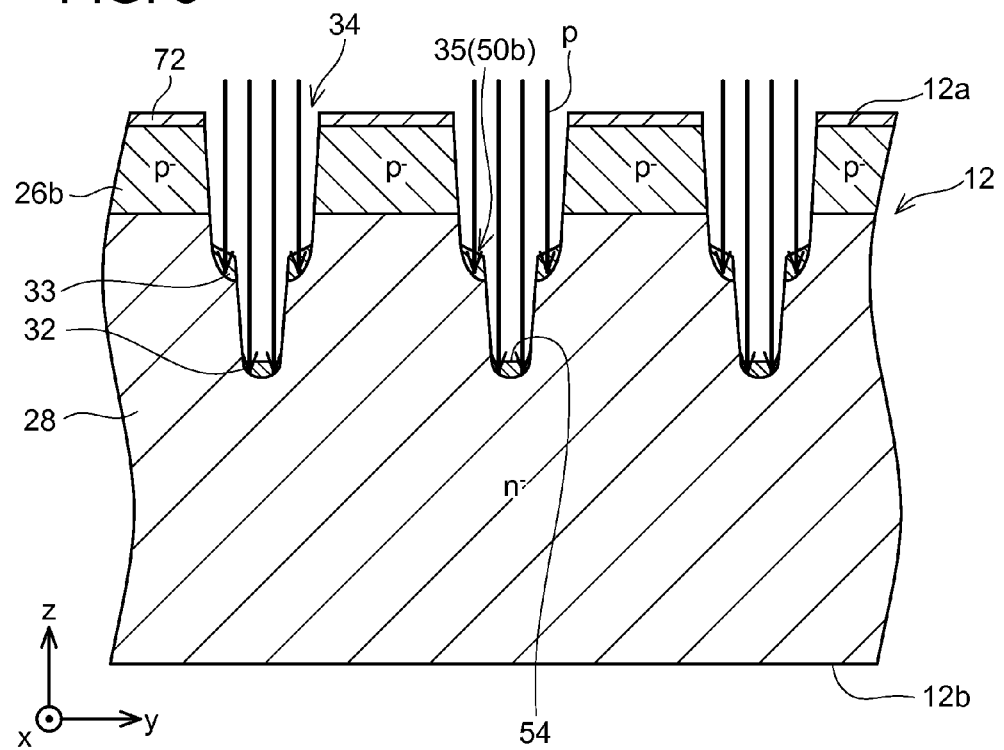
FIG. 8 is a vertical sectional view of the semiconductor substrate 12 into which ions are being implanted.
Figure 9:
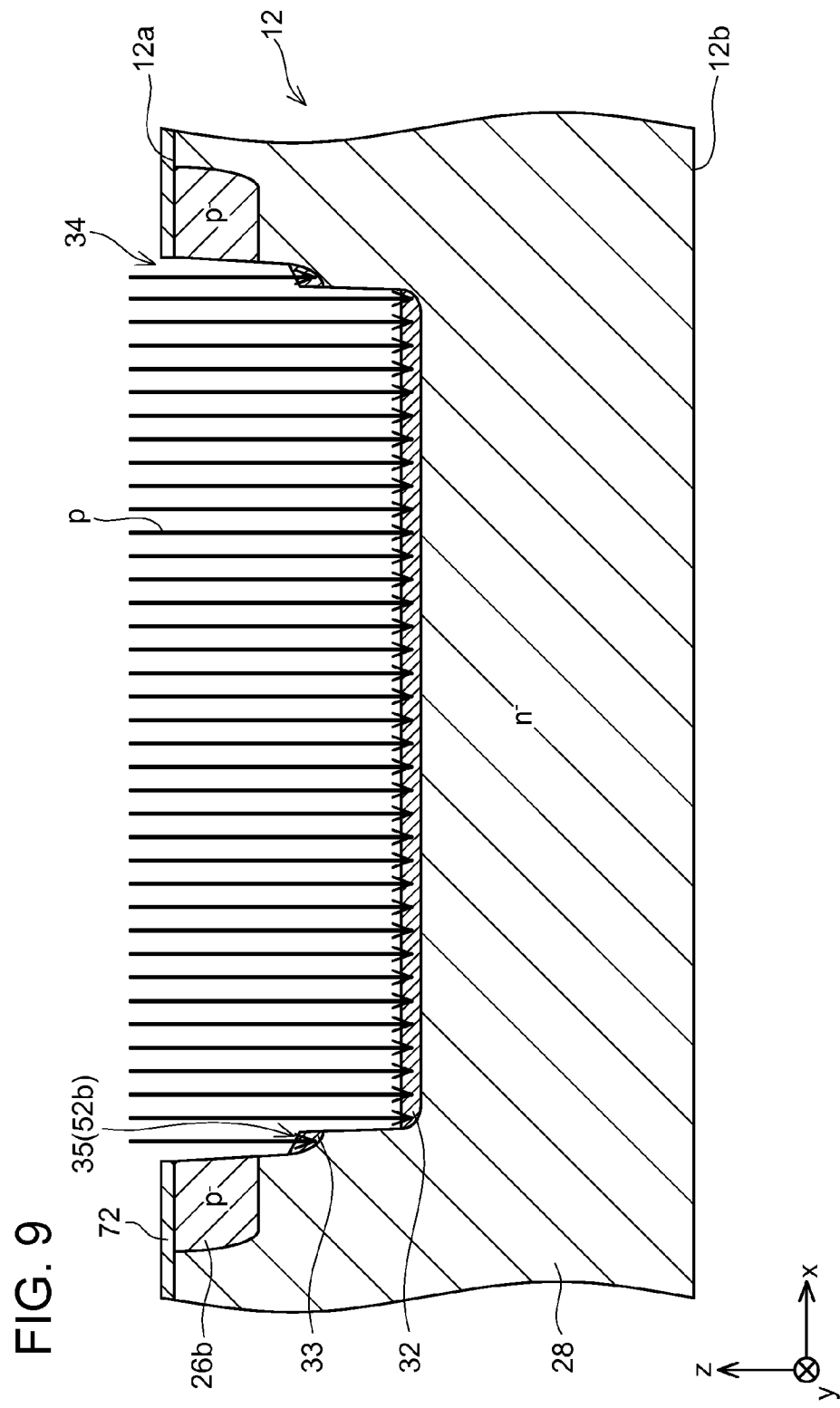
FIG. 9 is a vertical sectional view of the semiconductor substrate 12 into which ions are being implanted.

Next, as shown in FIGS. 8 and 9, an ion implantation mask 72 is formed on the front surface 12a of the semiconductor substrate 12, and p-type impurities are implanted into the semiconductor substrate 12 through the ion implantation mask 72. The p-type impurities are implanted into each trench 34. The p-type impurities are implanted into the bottom surface 54 of each trench 34 and the surfaces 50b and 52b of each step 35. This forms a bottom region 32 of the p-type in a range exposed on each bottom surface 54. Further, a lateral region 33 of the p-type is formed in a range exposed on the surfaces 50b and 52b of each step 35. As mentioned above, the surfaces 50*b* and 52*b* of each step 35 slope downward as the surfaces 50*b* and 52*b* extend toward the center of each trench 34. For this reason, a width of each lateral region 33 in the z direction can be made greater by forming each lateral region 33 by implanting the p-type impurities into the surfaces 50*b* and 52*b* of each step 35. On the other hand, the bottom surface 54 of each trench 34 is substantially flat. Therefore, a width of each bottom region 32 in the vertical direction is smaller than a width of each lateral region 33 in the vertical direction. Once the ion implantation is completed, the ion implantation mask 72 is removed.

Figure 10:
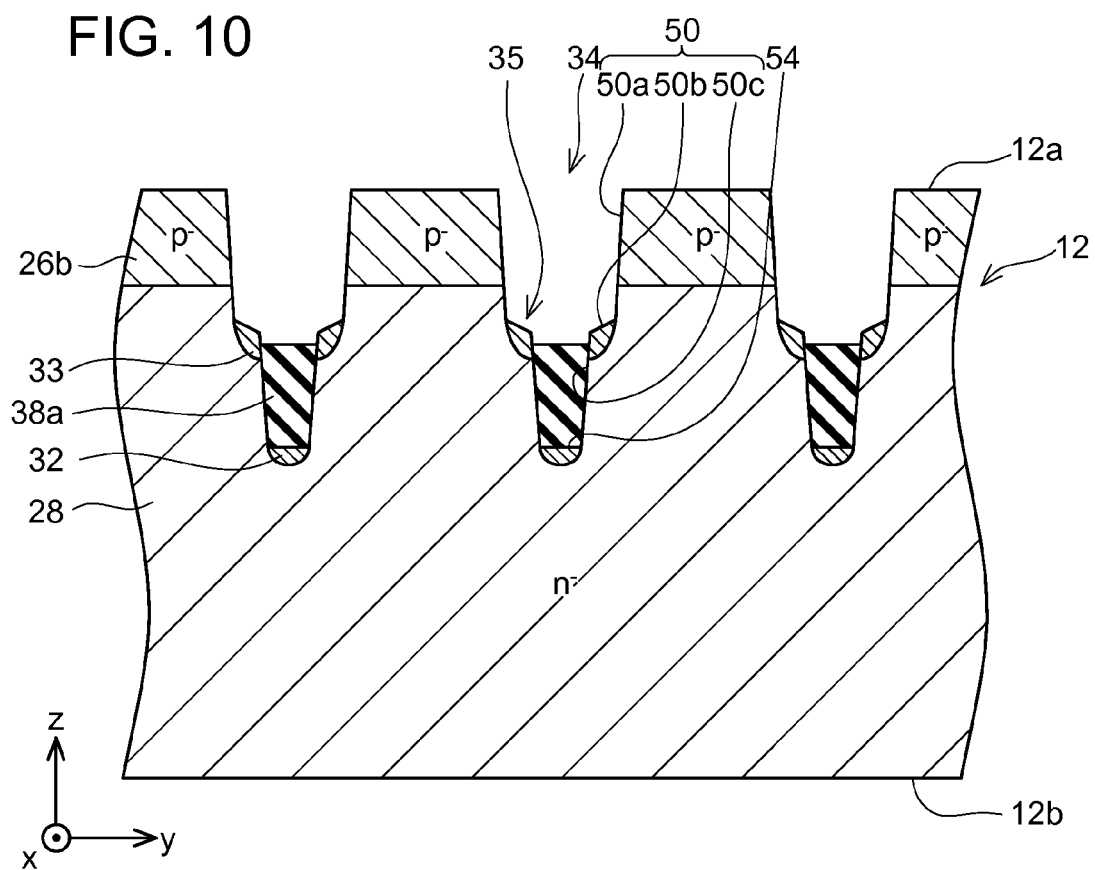
FIG. 10 is a vertical sectional view of the semiconductor substrate 12 in which a bottom insulating layer 38a has been formed.

Next, an insulating layer is grown in each trench 34 and on the semiconductor substrate 12. The insulating layer is filled fully in each trench 34. Next, the insulating layer is etched so that a portion of the insulating layer located on the semiconductor substrate 12 is removed and portions of the insulating layer located in each trench 34 are partially removed. As shown in FIG. 10, only portions of the insulating layer located on a lower side of each step 35 are allowed to remain. The remaining portions of the insulating layer serve as bottom insulating layers 38*a*.

Figure 11:
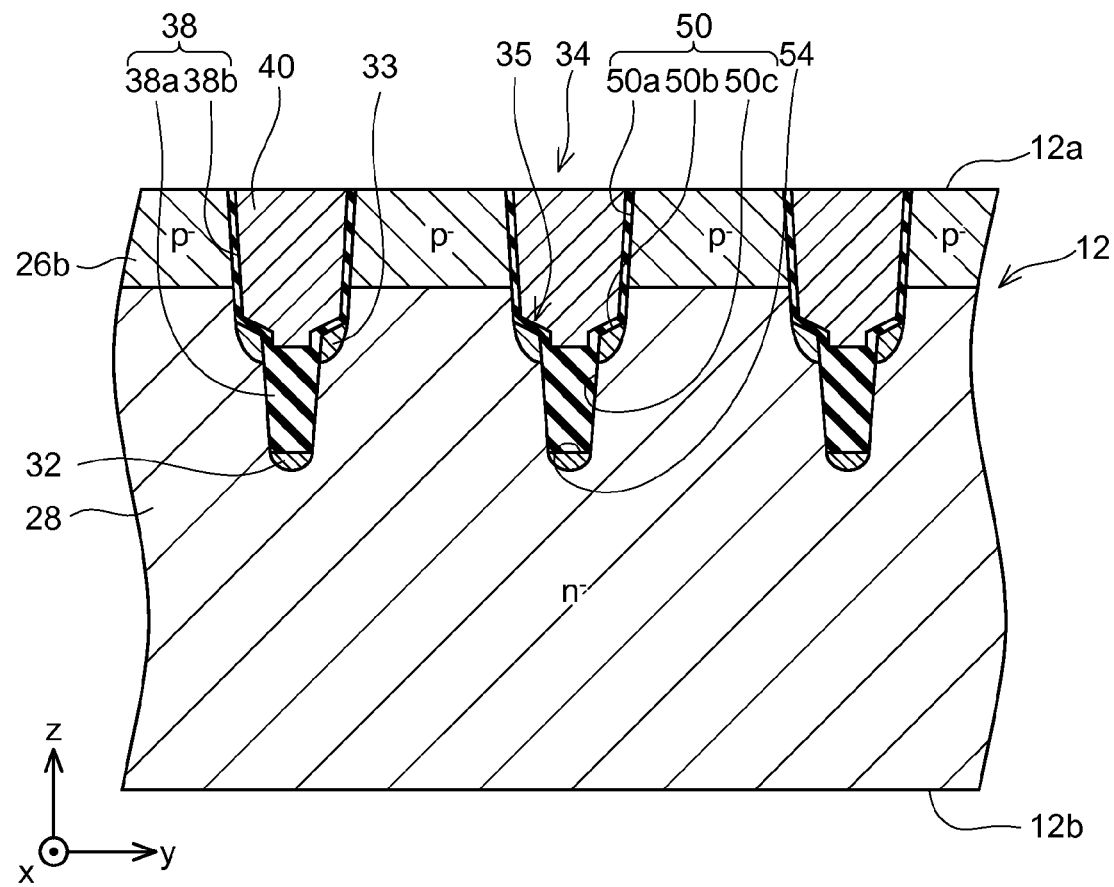
FIG. 11 is a vertical sectional view of the semiconductor substrate 12 in which a lateral insulating film 38b and a gate electrode 40 have been formed.

Next, as shown in FIG. 11, a lateral insulating film 38*b* is grown on portions of the lateral surface 50 of each trench 34 located on an upper side of each bottom insulating layer 38*a*. Although not illustrated, in a cross-section of each trench 34 in the longitudinal direction (i.e. the x direction) of each trench 34, too, the lateral insulating film 38*b* is grown on the lateral surface 52 (see FIG. 3) of each trench 34. Once each lateral insulating film 38*b* is formed, a gate electrode 40 is formed in each trench 34 as shown in FIG. 11.

Figure 12:
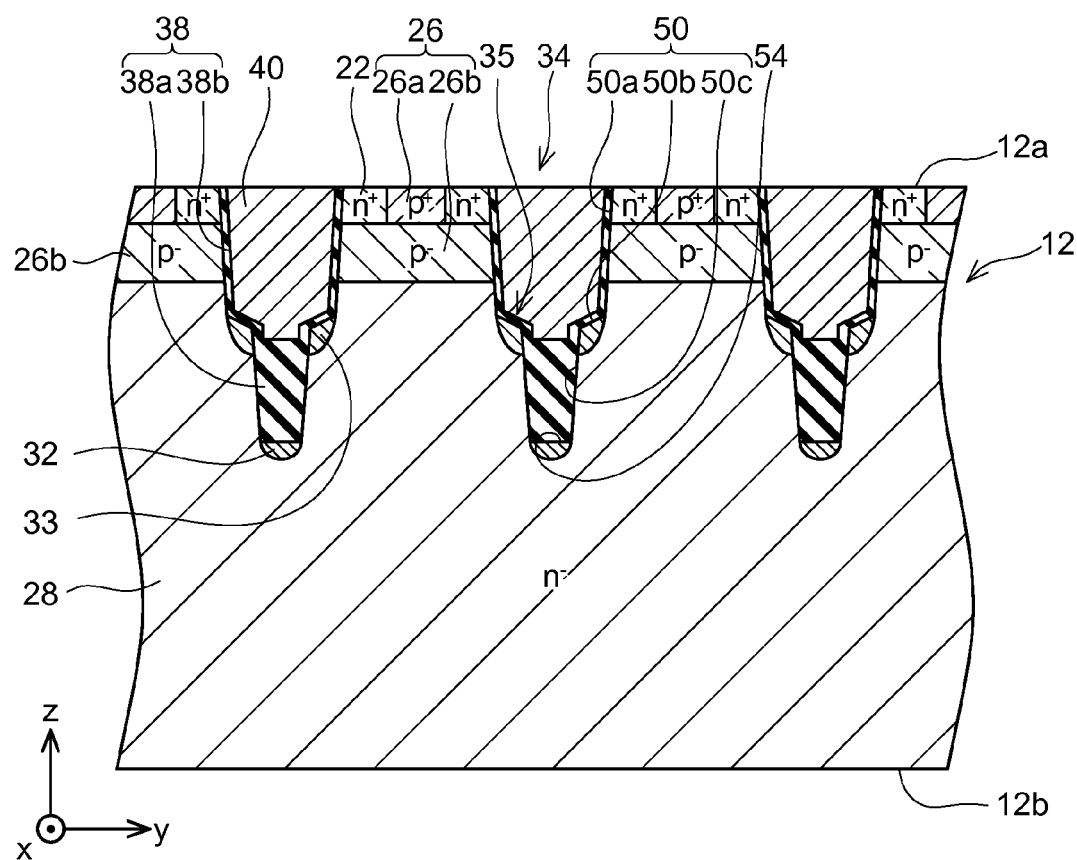
FIG. 12 is a vertical sectional view of the semiconductor substrate 12 in which a source region 22 and a high density region 26a have been formed.

Once gate electrodes 40 are formed, source regions 22 and high density regions 26*a* of the body region 26 are formed as shown in FIG. 12 by selectively implanting p-type and n-type impurities into the front surface 12*a* of the semiconductor substrate 12. Next, as shown in FIGS. 2 and 3, interlayer insulating layer 36*s* and a source electrode 80 are formed on the front surface 12*a* of the semiconductor substrate 12. Next, a drain region 30 is formed by implanting n-type impurities into a back surface 12*b* of the semiconductor substrate 12. Next, a drain electrode 84 is formed on the back surface 12*b* of the semiconductor substrate 12. Through these process steps, the semiconductor device 10 shown in FIGS. 1 to 3 is completed.

As described above, this method allows the trenches 34 having the steps 35 to be formed in a single etching process. This makes it possible to efficiently manufacture the semiconductor device 10.

Further, this method allows the surfaces 50*b* and 52*b* of each step 35 to be formed in a shape that slopes downward as the surfaces 50*b* and 52*b* extend toward the center of the trench 34. Therefore, lateral regions 33 having great widths in the z direction can be formed by implanting p-impurities into the surfaces 50*b* and 52*b* of each step 35. Therefore, this method makes it possible to manufacture the semiconductor device 10 having excellent withstand voltage characteristics.

Embodiment 2

Figure 13:
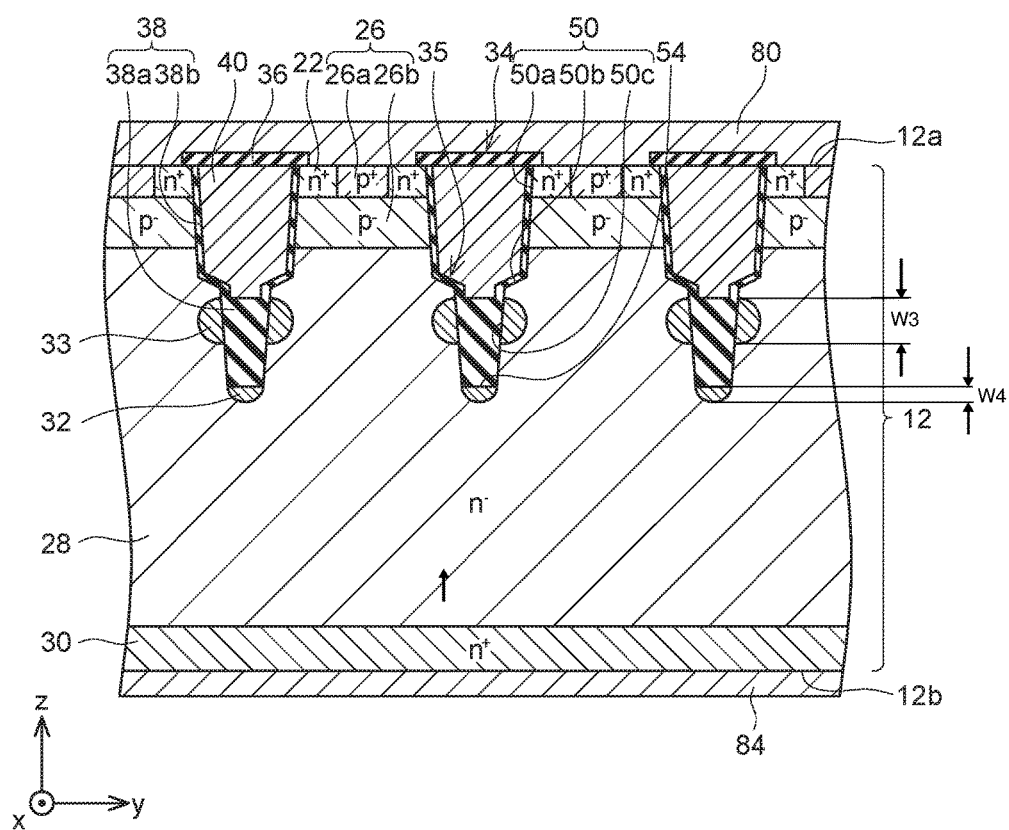
FIG. 13 is a vertical sectional view of a semiconductor device of Embodiment 2 that corresponds to FIG. 2.
Figure 14:
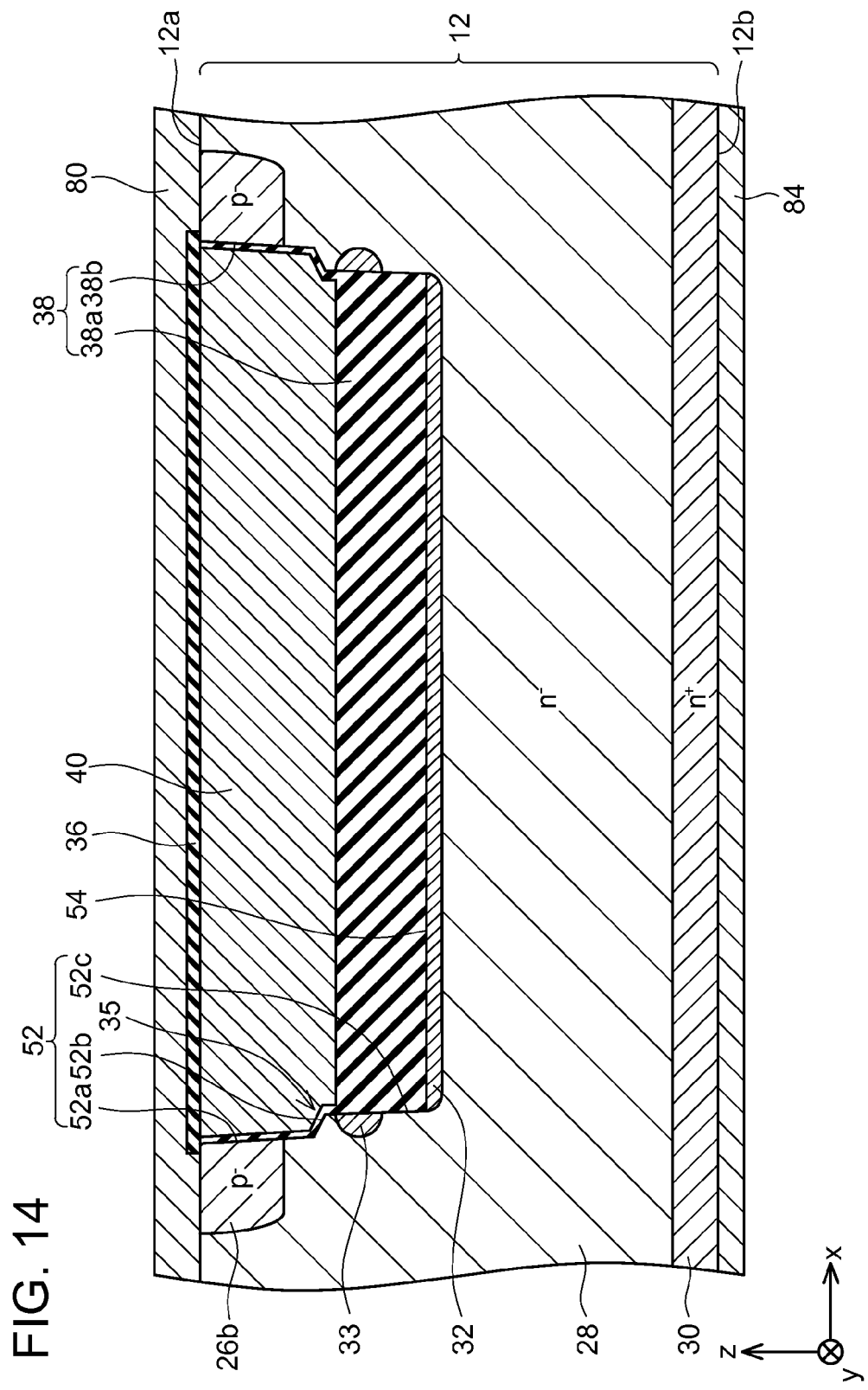
FIG. 14 is a vertical sectional view of the semiconductor device of Embodiment 2 that corresponds to FIG. 3.

FIGS. 13 and 14 show a semiconductor device of Embodiment 2. In the semiconductor device of Embodiment 2, each lateral region 33 is not in contact with the lateral insulating film 38*b* at the step surfaces 50*b* and 52*b* of each step 35. Each lateral region 33 is in contact with the bottom insulating layer 38*a* at the lower lateral surface 50*c*. At the step surfaces 50*b* and 52*b*, the drift region 28 is in contact with the lateral insulating film 38*b*. In this way, even when the lateral regions 33 are not exposed on the step surfaces 50*b* and 52*b*, the extension of a depletion layer can be facilitated by the lateral regions 33 when the MOSFET is turned off. That is, in the semiconductor device of Embodiment 2, as in the semiconductor device 10 of Embodiment 1, a concentration of electric fields is suppressed by the depletion layer. The semiconductor device of Embodiment 2 also has high withstand voltage characteristics. Further, the lateral regions 33 of Embodiment 2 can be formed by implanting p-type impurities at an energy higher than that in Embodiment 1 in implanting the p-type impurities into the step surfaces 50*b* and 52*b*. Implanting the p-type impurities into the step surfaces 50*b* and 52*b* at a high energy causes the p-type impurities thus implanted to stop at a deeper position (lower side) than that in Embodiment 1, and the lateral regions 33 are formed in the position at which the p-type impurities have stopped. That is, as shown in FIGS. 13 and 14, the lateral regions 33 can be formed at positions not exposed on the step surfaces 50*b* and 52*b*. Further, this method, too, makes it possible to form lateral regions 33 having great widths in the z direction, as the step surfaces 50*b* and 52*b* slope. A width W4 of each bottom region 32 from the upper end of the bottom region 32 to the lower end of the bottom region 32 in the vertical direction is smaller than the width W3 of the each lateral region 33 from the upper end of the lateral region 33 to the lower end of the lateral region 33 in the vertical direction, as shown in FIG. 13.

Embodiment 3

Figure 15:
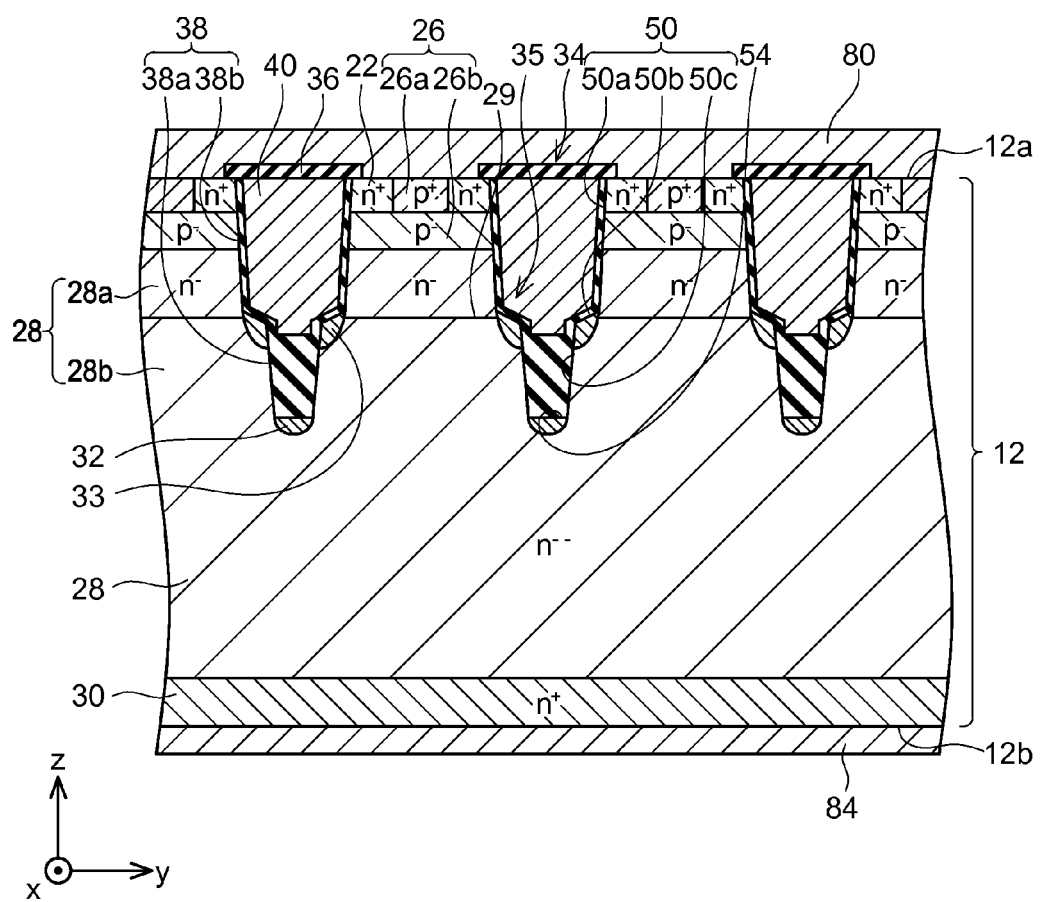
FIG. 15 is a vertical sectional view of a semiconductor device of Embodiment 3 that corresponds to FIG. 2.
Figure 16:
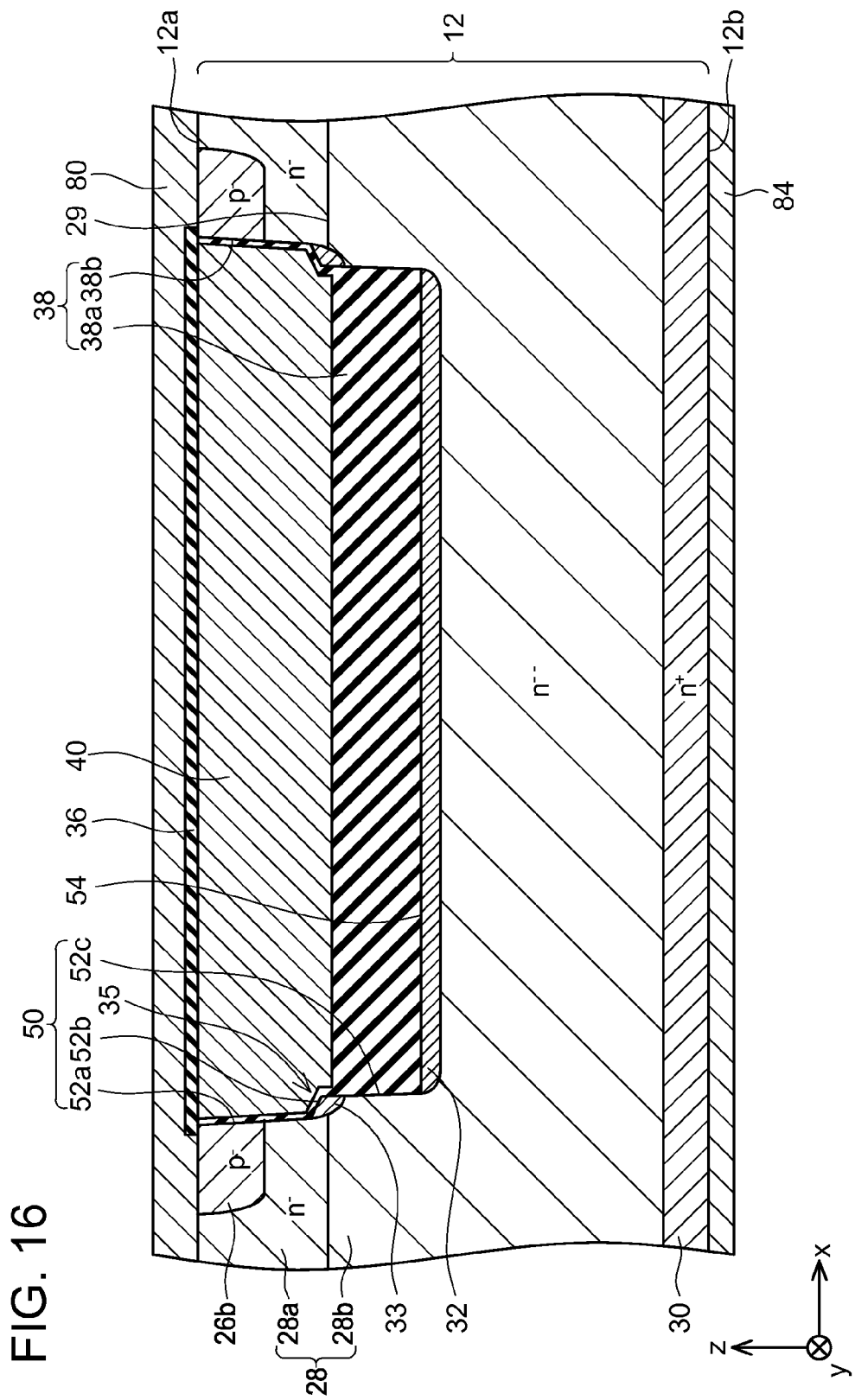
FIG. 16 is a vertical sectional view of the semiconductor device of Embodiment 3 that corresponds to FIG. 3.

FIGS. 15 and 16 show a semiconductor device of Embodiment 3. The semiconductor device of Embodiment 3 differs from the semiconductor device 10 of Embodiment 1 in terms of the structure of the drift region 28. The other components of the semiconductor device of Embodiment 3 are identical to those of the semiconductor device 10 of Embodiment 1. In the semiconductor device of Embodiment 3, the drift region 28 includes an upper region 28*a* and a lower region 28*b*. The upper region 28*a* has an n-type impurity density higher than that of the lower region 28*b*. The upper region 28*a* is provided on the lower side of the low density region 26*b* of the body region 26. The lower region 28*b* is provided on a lower side of the upper region 28*a*. The steps 35 are formed at a depth of a boundary 29 between the upper region 28*a* and the lower region 28*b*. That is, an extension line of the boundary 29 that extends toward the trench 34 intersects the steps 35. The semiconductor device of Embodiment 3 has as high withstand voltage characteristics as the semiconductor device 10 of Embodiment 1 does, as the lateral regions 33 are provided on the lower side of the steps 35.

Figure 17:
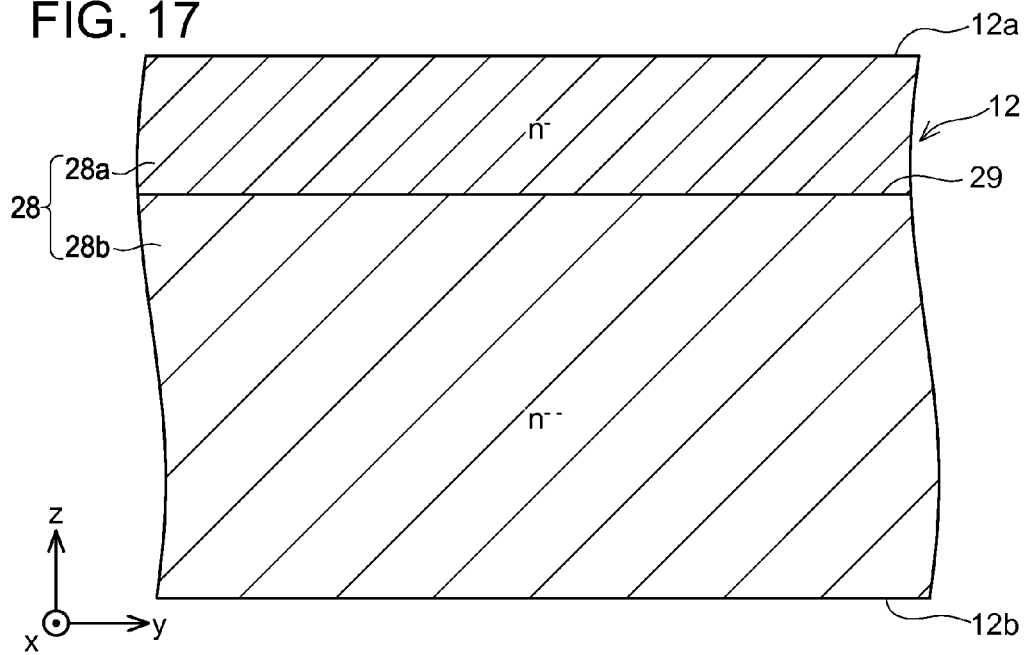
FIG. 17 is a vertical sectional view of the semiconductor substrate 12 in which an upper region 28a has been formed.

The following describes a method for manufacturing a semiconductor device of Embodiment 3. This semiconductor device is manufactured from an n-type semiconductor substrate 12 entirely having substantially the same n-type impurity density as that of the lower region 28*b* of the drift region 28. First, an n-type impurity density of a portion of the semiconductor substrate 12 located near the front surface 12*a* of the semiconductor substrate 12 is raised by implanting n-type impurity ions, whereby, as shown in FIG. 17, the upper region 28*a* is formed in a range exposed on the front surface 12*a* of the semiconductor substrate 12. The lower region 28*b*, which has a low n-type impurity density, remains on a lower side of the upper region 28*a*.

Figure 18:
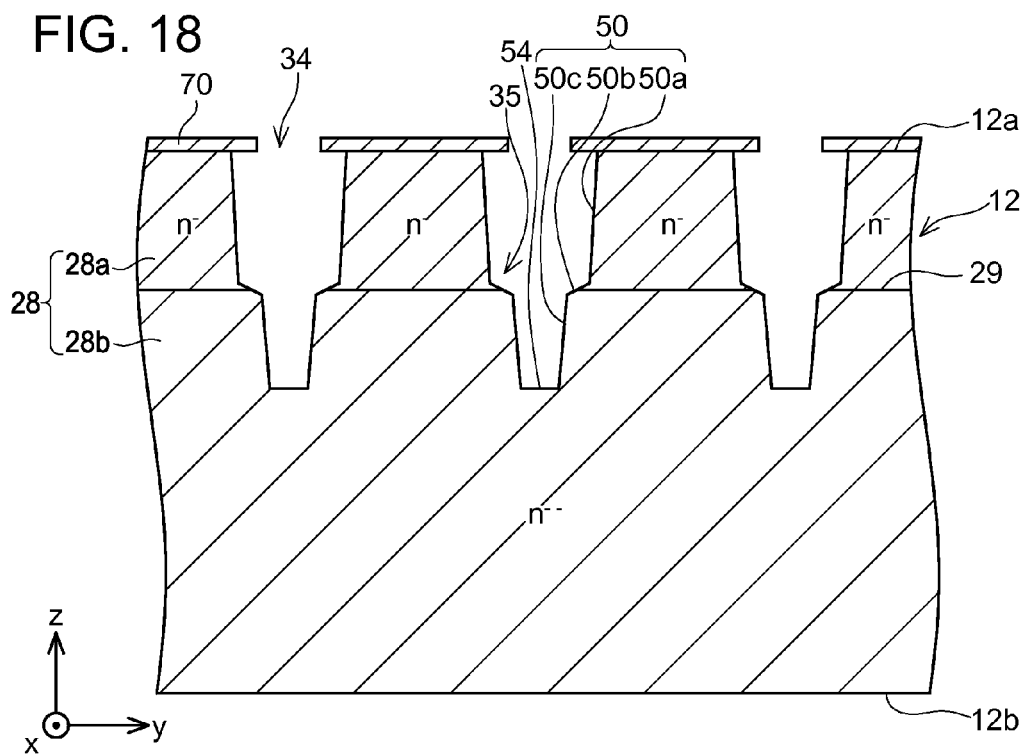
FIG. 18 is a vertical sectional view of the semiconductor substrate 12 in which a trench 34 has been formed.

Next, as shown in FIG. 18, an etching mask 70 is formed on the front surface 12*a* of the semiconductor substrate 12, and the semiconductor substrate 12 is etched through the etching mask 70. It should be noted here that the semiconductor substrate 12 is etched by anisotropic dry etching. This forms trenches 34 in the front surface 12a of the semiconductor substrate 12. As noted above, the n-type impurity density of the upper region 28a is higher than that of the lower region 28b. For this reason, an etching rate in the upper region 28a is higher than that in the lower region 28b. In other words, the upper region 28a is etched at a higher speed than the lower region 28b. For this reason, as shown in FIG. 18, the formation of each trench 34 that reaches the lower region 28b causes a width of the trench 34 in the upper region 28a to be greater than a width of the trench 34 in the lower region 28b. As a result, each step 35 is formed in a lateral surface of the trench 34 at the depth of the boundary 29 between the upper region 28a and the lower region 28b. Although not illustrated, each of the steps 35 are also formed in lateral surfaces of the trench 34 in a longitudinal direction of the trench 34. In this way, this method allows each trench 34 having steps 35 in its lateral surfaces 50 and 52 to be formed by utilizing the difference in etching rate between the upper region 28a and the lower region 28b that is caused by the difference in impurity density. This method allows each trench 34 having steps 35 to be formed in a single etching process. Further, this method allows each of the step surfaces 50b and 52b to be formed in a shape that allows the surfaces 50b and 52b to slope downward as they extend toward a center of the trench 34. Once the structure shown in FIG. 18 is obtained, the etching is stopped and the etching mask 70 is removed.

Figure 19:
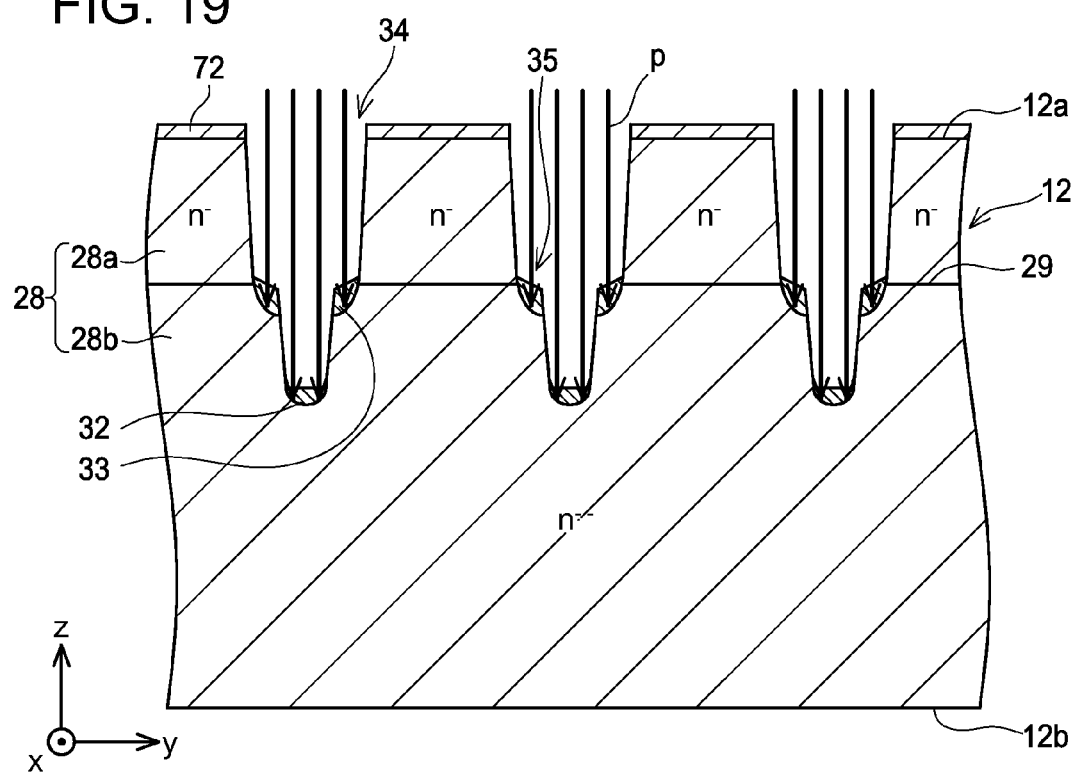
FIG. 19 is a vertical sectional view of the semiconductor substrate 12 into which ions are being implanted.

Next, as shown in FIG. 19, an ion implantation mask 72 is formed on the front surface 12a of the semiconductor substrate 12, and p-type impurities are implanted into the semiconductor substrate 12 through the ion implantation mask 72. The p-type impurities are implanted into the trenches 34. The p-type impurities are implanted into the bottom surfaces 54 of the trenches 34 and the step surfaces 50b and 52b. This forms bottom regions 32 of the p-type in ranges exposed on the bottom surfaces 54. Further, lateral regions 33 of the p-type are formed in ranges exposed on the step surfaces 50b and 52b. As mentioned above, each of the step surfaces 50b and 52b slopes downward as it extends toward the center of each trench 34. For this reason, width of the lateral regions 33 in the z direction can be made greater by forming the lateral regions 33 by implanting the p-type impurities into the step surfaces 50b and 52b. Once the ion implantation is completed, the ion implantation mask 72 is removed.

Figure 20:
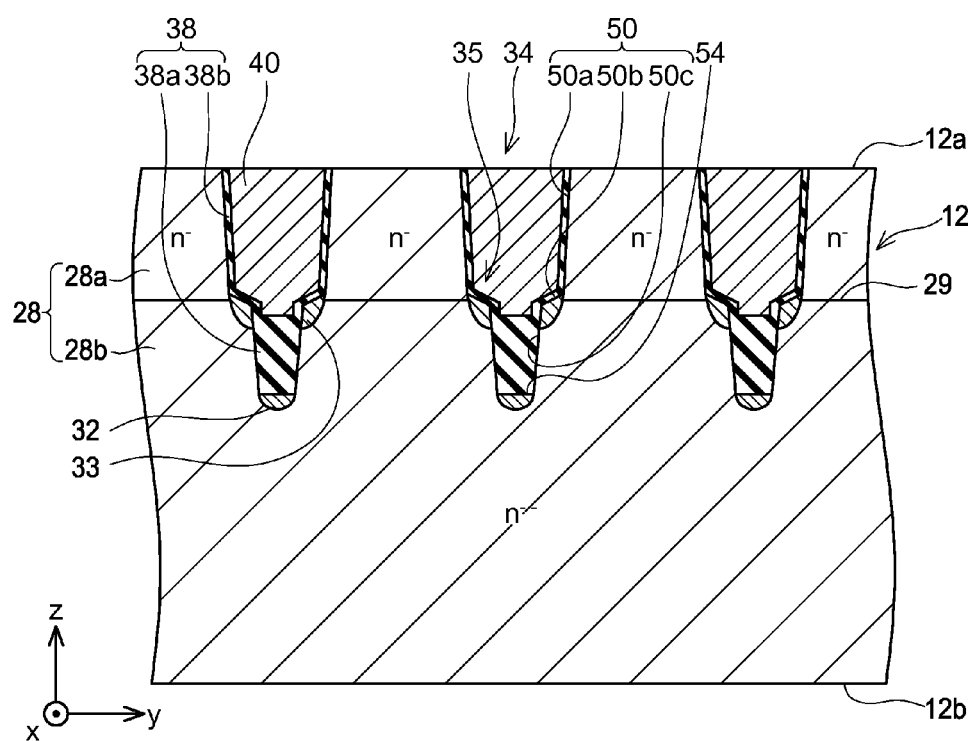
FIG. 20 is a vertical sectional view of the semiconductor substrate 12 in which a bottom insulating layer 38a, a lateral insulating film 38b, and a gate electrode 40 have been formed.

Next, as shown in FIG. 20, a bottom insulating layer 38a, a lateral insulating film 38b, and a gate electrode 40 are formed in each trench 34 in the same manner as that described in Embodiment 1. Next, source regions 22, high density regions 26a, and low density regions 26b are formed by selectively implanting p-type and n-type impurities into the front surface 12a of the semiconductor substrate 12. After that, the semiconductor device of Embodiment 3 as shown in FIGS. 15 and 16 is completed by forming interlayer insulating layers 36, a source electrode 80, a drain region 30, and a drain electrode 84 in the same manner as that described in Embodiment 1.

It should be noted that in the semiconductor device of Embodiment 3, each step 35 is formed at the position of the boundary 29 between the upper region 28a and the lower region 28b. However, each step 35 may alternatively be formed at a position located on a lower side of the boundary 29. The steps 35 can be formed on the lower side of the boundary 29 by extending the duration of the etching process for forming the trenches 34.

Embodiment 4

Figure 21:
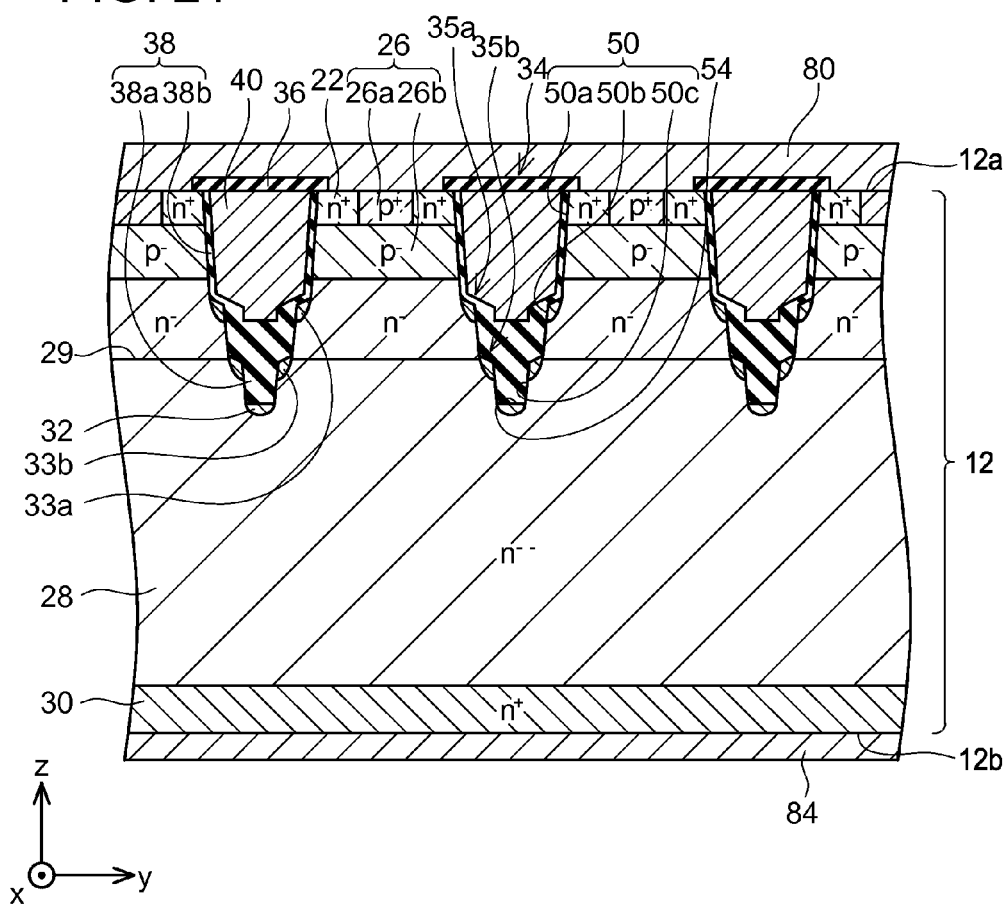
FIG. 21 is a vertical sectional view of a semiconductor device of Embodiment 4 that corresponds to FIG. 2.

FIG. 21 shows a semiconductor device of Embodiment 4. In the semiconductor device of Embodiment 4, two steps 35a and 35b are formed in each lateral surface of each of the trenches 34. Lateral regions 33a and 33b are formed so as to be in contact with the gate insulating layers 38 on the surfaces of the steps 35a and 35b, respectively. Each low density region 26b of the body region 26 has a p-type impurity density higher than an n-type impurity density of each of the upper regions 28a of the drift region 28. Each upper region 28a of the drift region 28 has an n-type impurity density higher than that of the lower region 28b. The upper steps 35a are steps formed by utilizing the difference in impurity density between the low density regions 26b and the upper regions 28a in the same manner as that described in Embodiment 1. The lower steps 35b are steps formed by utilizing the difference in impurity density between the upper regions 28a and the lower regions 28b in the same manner as that described in Embodiment 3. A combination of a method for forming a trench in Embodiment 1 and a method for forming a trench in Embodiment 3 makes it possible to form such trenches 34. That is, trenches 34 having two steps 35a and 35b can be formed in a single etching process. Further, by thus providing a plurality of steps 35a and 35b (i.e. a plurality of lateral regions 33a and 33b), the withstand voltage characteristics of the semiconductor device can be further improved.

It should be noted that in each of the semiconductor devices of Embodiments 3 and 4, too, the lateral regions 33 may be formed on the lower side of the steps 35 as shown in FIG. 13.

Further, in each of the embodiments described above, the potential of each bottom region 32 is a floating potential. However, each bottom region 32 may be connected to a predetermined fixed potential.

Further, in each of the embodiments described above, a MOSFET of an n-channel type has been described. However, the technology disclosed herein may be applied to a MOSFET of a p-channel type.

Further, in each of the embodiments described above, the steps 35 and the lateral regions 33 are formed on both the lateral surfaces 50 of the trenches 34 in the transverse direction (y direction) of the trenches 34 and the lateral surfaces 52 of the trenches 34 in the longitudinal direction (x direction) of the trenches 34. However, the steps 35 and the lateral regions 33 may alternatively be formed only on either of these lateral surfaces 50 and 52.

Further, in each of the embodiments described above, each bottom insulating layer 38a is located on the lower side of the step 35. That is, an upper end of each bottom insulating layer 38a is located on the lower side of the step 35. However, the upper end of each bottom insulating layer 38a may be located on the upper side of the step 35, provided it is located on the lower side of the body region 26. The upper end of each bottom insulating layer 38a may be located at any position, provided it is located on the lower side of the body region 26.

Correspondence between the components of each of the embodiments described above and the components of claims is described. The lateral surface 52 of each of the embodiments is an example of the lateral surface defining an end of the trench in a longitudinal direction of the trench in claims. The each source region 22 of each of the embodiments is an example of the first region of the claims. The drift region 28 of each of the embodiments is an example of the second region of claims. The drift region 28 of Embodiment 1 is an example of the low density semiconductor region of claims. The lower density region 26b of Embodiment 1 is an example of the high density semiconductor region of claims. The lower region 28b of Embodiment 3 is an example of the low density semiconductor region of claims. The upper region 28a of Embodiment 3 is an example of the high density semiconductor region of claims.

The following enumerates the technical elements disclosed herein. It should be noted that the following technical elements are useful independently of one another.

In a configuration disclosed herein as an example, a width of the lateral region in a vertical direction which extends from the upper side to the lower side may be greater than a width of the bottom region in the vertical direction.

In a configuration disclosed herein as an example, the lateral region may be in contact with the gate insulating layer at the step surface.

In a configuration disclosed herein as an example, the second region may be in contact with the gate insulating layer at the step surface. The lateral region may be configured not to be in contact with the gate insulating layer at the step surface.

In a configuration disclosed herein as an example, the step may be formed in the lateral surface defining an end of the trench in a longitudinal direction of the trench. The lateral region may be in contact with the gate insulating layer at the lower lateral surface of the lateral surface defining the end of the trench.

Such a configuration makes it possible to suppress an electric field in the vicinity of the end of the trench in the longitudinal direction of the trench.

In a configuration disclosed herein as an example, the second region may comprise an upper region and a lower region. The lower region may have a density of impurities of the first conductivity type lower than that of the upper region and may be located under the upper region. The step may be formed at a position of a boundary between the upper region and the lower region or at a position located on the lower side of the boundary.

This configuration makes it possible to form the step by utilizing a difference in density within the second region (i.e. a difference in density between the upper region and the lower region).

In a manufacturing method disclosed herein as an example, the high density semiconductor region may be a body region being of the second conductivity type. The low density semiconductor region may be a second region being of the first conductivity type and having a density of impurities of the first conductivity type lower than a density of impurities of the second conductivity type in the body region. The step may be located on a lower side of a boundary between the body region and the second region. The method may be adapted for manufacturing a semiconductor device comprising a first region being of the first conductivity type, separated from the second region by the body region, and being in contact with the gate insulating layer at a portion of the lateral surface located on an upper side of the step. The method may further comprise forming the first region being of the first conductivity type in the semiconductor substrate after the formation of the trench.

This configuration makes it possible to form the step by utilizing a difference in density between the body region of the second conductivity type and the second region of the first conductivity type.

In a manufacturing method disclosed herein as an example, in the implantation of the impurities of the second conductivity type, a lateral region being of the second conductivity type may be formed in a range exposed on both of the step surface and a portion of the lateral surface of the trench located on the lower side of the step.

In a manufacturing method disclosed herein as an example, in the implantation of the impurities of the second conductivity type, a lateral region being of the second conductivity type may be formed in a range not exposed on the step surface but exposed on a portion of the lateral surface of the trench located on the lower side of the step.

In a manufacturing method disclosed herein as an example, the step may be formed in the lateral surface of the trench defining an end of the trench in a longitudinal direction of the trench.

In a manufacturing method disclosed herein as an example, the high density semiconductor region may be an upper region being of the first conductivity type. The low density semiconductor region may be a lower region being of the first conductivity type. The method may be adapted for manufacturing a semiconductor device comprising: a body region and a first region. The body region may be of the second conductivity type and in contact with the gate insulating layer at a portion of the lateral surface of the trench located on the upper side of the upper region. The first region may be of the first conductivity type and in contact with the gate insulating layer at a portion of the lateral surface of the trench located on the upper side of the body region. The first region may be separated from the upper region by the body region. The method may further comprise forming the first region and the body region in the semiconductor substrate after the formation of the trench.

This method makes it possible to form the step by utilizing a difference in density between the upper region and the lower region.

The embodiments have been described in detail in the above. However, these are only examples and do not limit the claims. The technology described in the claims includes various modifications and changes of the concrete examples represented above. The technical elements explained in the present description or drawings exert technical utility independently or in combination of some of them, and the combination is not limited to one described in the claims as filed. Moreover, the technology exemplified in the present description or drawings achieves a plurality of objects at the same time, and has technical utility by achieving one of such objects.

What is claimed is:

1. A semiconductor device, comprising:
   a semiconductor substrate having a surface in which a trench is provided;
   a gate insulating layer covering an inner surface of the trench; and
   a gate electrode located in the trench,
   wherein
   a step is provided in a lateral surface of the trench,
   the lateral surface of the trench comprises an upper lateral surface located on an upper side of the step, a step surface, and a lower lateral surface located on a lower side of the step,
   the step surface slopes downward as it extends toward a center of the trench, and
   the semiconductor substrate comprises:
   a first region being of a first conductivity type and in contact with the gate insulating layer at the upper lateral surface;

a body region being of a second conductivity type and in contact on the lower side of the first region with the gate insulating layer at the upper lateral surface;

a second region being of the first conductivity type, extending from a position in contact with the body region to a position located on the lower side of a bottom surface of the trench, being in contact on the lower side of the body region with the gate insulating layer at the upper lateral surface, and being in contact with the gate insulating layer at the lower lateral surface;

a lateral region being of the second conductivity type, being in contact with the gate insulating layer at the lower lateral surface, surrounded by the second region, and separated from the body region by the second region; and a bottom region being of the second conductivity type, being in contact with the gate insulating layer at the bottom surface of the trench, surrounded by the second region, and separated from the body region and the lateral region by the second region, wherein a width of the lateral region from an upper end of the lateral region to a lower end of the lateral region in a vertical direction which extends from the upper end of the lateral region to the lower end of the lateral region is greater than a width of the bottom region from an upper end of the bottom region to a lower end of the bottom region in the vertical direction.

2. The semiconductor device of claim 1, wherein the lateral region is in contact with the gate insulating layer at the step surface.

3. The semiconductor device of claim 1, wherein the second region is in contact with the gate insulating layer at the step surface, and the lateral region is not in contact with the gate insulating layer at the step surface.

4. The semiconductor device of claim 1, wherein the step is provided in the lateral surface defining an end of the trench in a longitudinal direction of the trench, and the lateral region is in contact with the gate insulating layer at the lower lateral surface of the lateral surface defining the end of the trench.

5. The semiconductor device of claim 1, wherein the second region comprises:

an upper region; and a lower region having a density of impurities of the first conductivity type lower than that of the upper region and located under the upper region, and the step is provided at a position of a boundary between the upper region and the lower region or at a position located on the lower side of the boundary.

* * * * *